US006237399B1

(12) United States Patent
Shivaram et al.

(10) Patent No.: US 6,237,399 B1
(45) Date of Patent: May 29, 2001

(54) CANTILEVER HAVING SENSOR SYSTEM FOR INDEPENDENT MEASUREMENT OF FORCE AND TORQUE

(76) Inventors: Bellave S. Shivaram, 2161 Wingfield Rd., Charlottesville, VA (US) 22901; Murali V. Chaparala, 4109 SE. 183$^{rd}$Pl., Vancouver, WA (US) 98683; Stephen H. Jones, 9971, Critzer Shop Rd., Afton, VA (US) 22920

( * ) Notice: Subject to any disclaimer, the term of this patent is extended or adjusted under 35 U.S.C. 154(b) by 0 days.

(21) Appl. No.: 09/232,875

(22) Filed: Jan. 15, 1999

Related U.S. Application Data

(60) Provisional application No. 60/071,696, filed on Jan. 16, 1998.

(51) Int. Cl.$^7$ ................................ G01B 5/28; G01B 7/34
(52) U.S. Cl. ............................................................. 73/105
(58) Field of Search ................................ 73/105; 250/306, 250/307

(56) References Cited

U.S. PATENT DOCUMENTS

| | | | |
|---|---|---|---|
| 5,345,815 | 9/1994 | Albrecht et al. | 73/105 |
| 5,483,822 | 1/1996 | Albrecht et al. | 73/105 |
| 5,595,942 | 1/1997 | Albrecht et al. | 437/228 |
| 5,723,775 | * 3/1998 | Watanabe et al. | 73/105 |
| 5,739,686 | 4/1998 | Naughton et al. | 324/259 |

OTHER PUBLICATIONS

"Capacitance Platform Magnetometer for Thin Film and Small Cyrstal Superconductor Studies", M. Chaparala, O. H. Chung, and M. J. Naughton; American Institute of Physics, 1992. AIP Conference proceedings #273, p. 407.

"Atomic Resolution with an Atomic Force Microscope With Piezoresistive Detection", M. Totonese, R.C. Barrett, and C.F. Quate; Applied Physics Letter, 62, 1993, p. 834.

* cited by examiner

*Primary Examiner*—Daniel S. Larkin
(74) *Attorney, Agent, or Firm*—Sheldon H. Parker

(57) ABSTRACT

A cantilever structure is provided having a cantilever arm with a piezo-active detector embedded on the surface at the fixed end of the cantilever as well as at a sensing point close to the free end along with an integrated amplification circuitry. Deflection of the cantilever arm is initiated by two different methods: (a) by a force at the free end which induces a surface strain at the base of the cantilever and no strain at the free end and (b) by a torque at the free end which induces a maximum strain at the free end but no strain at the base of the cantilever. In the first case a piezo-active signal is produced only in the detector at the base and in the second case only in the detector close to the free end. When both force and torque cause the deflection of the cantilever end, their contributions are separated by comparing the signals produced by both the detectors with that produced by a third 'reference' detector which is not part of the cantilever arm but is still situated in close proximity.

30 Claims, 7 Drawing Sheets

CANTILEVER HAVING SENSOR SYSTEM FOR INDEPENDENT MEASUREMENT OF FORCE AND TORQUE

CROSS-REFERENCE TO RELATED APPLICATION

This application is a continuation-in-part of now abandoned provisional patent application, Independent Force and Torque Measuring Technique for Cantilever Sensors, Ser. No. 60/071,696, filed, Jan. 16, 1998, the disclosure of which is incorporated herein, by reference, as though recited in full.

This invention was made under a contract with an agency of the United States Government, NSF DMR 9624468 and DMR 9223576.

BACKGROUND OF THE INVENTION

1. Field of the Invention

This invention relates cantilevers embedded with sensors on surface and integrated amplification circuitry responding to deflection of the cantilever useable in magnetic disk drives, magnetic force microscopes, magnetic resonance force microscopes, accelerometers, and other systems where a sensing of a mechanical deflection is involved.

2. Brief Description of the Prior Art

A number of cantilever sensors have been patented recently and commercial models of these sensors are now available in microminiature form. All of these cantilever sensors use passive detectors to sense the deflection of the free end of the cantilever. For example, the cantilever magnetometer developed by Naughton and Chaparala (AIP conference proceedings #273, p.407, 1992, "Capacitance Platform Magnetometer for thin film and small crystal superconductor studies and U.S. Pat. N0. 5,739,686, the disclosure of which is incorporated herein, by reference, as though recited in full) consists of two capacitor plates, one of which is roughly Five microns thick, and machined out of a silicon wafer. The two plates are glued together to a sample platform with the top plate free to bend as a cantilever. This cantilever design has been used in the sensitive measurements of the magnetic properties of materials in very high fields and over a very broad temperature range. In these measurements, a small piece of a magnetic sample is glued to the free end of the cantilever. Any external magnetic field acts on the magnetic sample and causes the cantilever to deflect and thus change the capacitance. However, this cantilever design and the capacitance method of detecting the deflection of the cantilever suffers from the drawback that it is not possible to determine whether it is the force or the torque acting on the magnetic sample that is causing the deflection of the cantilever tip.

Another example of an existing cantilever sensor is the Atomic Force Microscope (AFM) cantilever of Albrecht et. al. (U.S. Pat. N0. 5,483,822), the disclosure of which is incorporated herein, by reference, as though recited in full, and Applied Physics Letters, 62, p.634, 1993, "Atomic Resolution with an Atomic Force Microscope with Piezoresistive Detection"). Here, the deflection of the cantilever is obtained by measuring the change in the resistance of a layer of doped silicon on the cantilever which itself is micromachined from a block of single crystal silicon. This design also suffers from the inability to distinguish between a force and a torque signal and furthermore requires external amplification circuitry to magnify the effects of the change in the resistance of the doped silicon layer.

Additional background as to cantilevers with piezoresistive deflection sensors are found in U.S. Pat. Nos. 5,345,815 and 5,595,942, the disclosures of which are incorporated herein, by reference, as though recited in full.

SUMMARY OF THE INVENTION

It has now been discovered, that improved operation and capabilities of a cantilever measuring device can be achieved through the separate measurement of force and torque contributions to the deflection of the cantilever. Using recent technological improvements in the processing of semiconducting and ferromagnetic materials (Si & Fe), a new type of cantilever sensor with active detectors has been fabricated, which enables the separation of the measurement of the force and torque contributions to the deflection of the cantilever. The active detectors provide an order of magnitude more sensitive than the above described capacitance cantilever sensor. These new sensors utilize the strain dependence in the characteristics of Field Effect Transistors (FETs) placed on the surface of the cantilevers. The FETs have thus been integrated into the cantilever sensor and this has enabled the deflection induced signals to become amplified at the very point of origin. It has also enabled the use of the sensors in environments where low power dissipation is necessary. These sensors are useful in scanning probe magnetic force microscopy MFM), magnetic resonance force microscopy, force and/or torque magnetometry, in reading of all types of magnetic information, including those on disk drives and agglomerates of magnetic molecules and atoms. The use of the new integrated FET sensors, in addition to increasing the sensitivity, has simplified many of the measurement processes by eliminating the number of external components needed. Furthermore, the technology we have developed is modular in nature and several sensor models scaleable for smaller/larger signals have been built.

The present invention is a cantilever arm with a detector (passive or active) at the fixed (base) end of the cantilever and a second similar detector at the free end for use in separating the force and torque contributions to the deflection of the cantilever. Deflection of the free end of the cantilever by a force produces a strain in the base of the cantilever and the deflection of the free end by a torque produces no strain in the base but produces maximum strain at the free end. That difference in the changes of the surface strains produce changes in an appropriate physical property of the detectors in proportion to the cantilever arm's deflection. A voltage measuring apparatus is coupled to the two detectors to generate a signal corresponding to the cantilever arm's deflection.

The cantilever is formed on an appropriate substrate, such as a semiconductor like silicon or gallium arsenide, glass or quartz, or plastics, such as Kapton, polymide etc. A metal layer is deposited over the substrate's surface and patterned to form an electrical connection between the detectors and a voltage measuring circuit. The substrate below said cantilever arm is substantially removed so as to form a cantilevered structure. A magnetic tip is connected to the free end of the cantilever arm to facilitate the structure's use in mapping magnetic features on a surface of interest, such as a magnetic storage disk, and other similar devices.

DESCRIPTION OF THE PREFERRED EMBODIMENTS

Figure 1:
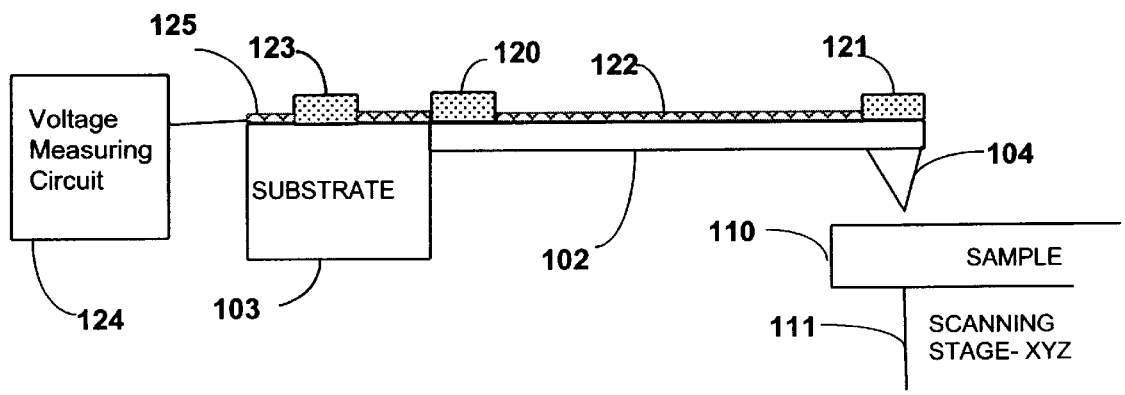
FIG. 1 is a schematic block diagram of a cantilever sensor incorporating the present invention.

FIG. 1 illustrates a diagram of a cantilever incorporating the present invention. A cantilever arm 102 with a projecting magnetic tip 104 at its free end is used to probe the surface of a sample 110. Deflection of the cantilever 102 by surface magnetic features of the sample changes the voltage from FET 120 on the cantilever by an amount that is proportional to the cantilever's deflection due to a force. Deflection of the cantilever 102 by surface magnetic features of the sample changes the voltage from FET 121 on the cantilever by an amount that is proportional to the cantilever's deflection due to a torque. Both the FETs 120 and 121 are coupled by metal connector 122 to a voltage measurement circuit 124. Typically, circuit 124 is a differential amplifier circuit which includes the reference FET 123 and any other conventional voltage measuring circuit. The circuit 124 produces two separate measurement signals corresponding to deflection of the cantilever due to both a force and a torque and is connected to all the three FETs by metallic contacts 125. The cantilever itself is formed by removing a substantial amount of material from the substrate 103. The magnetic sample 110 is scanned relative to the tip 104 by an X-Y-Z stage 111. In a slight modification of the above described configuration the sample 110 is non-existent, instead the tip 104 itself becomes the sample. The entire assembly is then immersed in an external magnetic field, which may be produced by a variety of sources, and the effect of the magnetic field on the sample is obtained by measuring the deflection of the cantilever.

Prior art devices such as an atomic force microscope (AFM's) with a piezoresistor or the capacitance cantilever detect simply the total motion of the cantilever end. They do not distinguish between a force and a torque causing the deflection. Although in the former case (Atomic Force Microscope with a Piezoresistor), a voltage signal is provided, an external amplifier is needed to boost the voltages to measurable levels (Albrecht et. al.(U.S. Pat. No. 5,483,822 and Applied Physics Letters, 62, p.634, 1993, "Atomic Resolution with an Atomic Force Microscope with Piezoresistive Detection"). In the present embodiment, the amplification is provided by the FETs used on the cantilever; thus, the voltage signals produced by the deflection are amplified on the cantilever itself. Additional advantage of the present invention is that it allows separating the contributions from the force and the torque causing the deflection of the cantilever.

The silicon cantilever magnetometer of Naughton and Chaparala (AIP conference proceedings #273, p.407, 1992, "Capacitance Platform Magnetometer for Thin Film and Small Crystal Superconductor Studies" and U.S. Pat. No. 5,739,686) uses capacitance detection to measure the displacement of the free end of the cantilever and integrated cancellation coils for null detection. The drift in the capacitance detection of the magnetometer is small, at higher temperatures the inherent drift in the capacitance measurement reduces the device sensitivity. Furthermore, the detection capacitor formed by the cantilever and a nearby fixed plate is a post fabrication assembly and as such is irreproducible. The reproducibility advantages gained by micro machining are lost in the final assembly process. The active piezovoltage detection scheme of the present invention has overcome the short comings of the capacitance detection since the piezo-detection is integrated into the cantilever during the fabrication process. This design has maintained the advantages of the old design, such as the null detection and wide dynamic range, while improving on the sensitivity and high temperature performance of the device. Use of the active component (FET) has improved the sensitivity by amplifying the signal right at the sensor. The integrated cantilever magnetometer with the differential FET amplifier detection has a sensitivity of $10^{-10}$emu, and is much easier to use than the one with the capacitance detection. In a typical measurement, the sample is glued to the free end of the cantilever and is subjected to an external magnetic field oriented along the length of the cantilever as shown in the adjacent figure. The error signal from the FET detector is used to power a proportional differential feedback circuit which passes a current through the compensation loops thus enabling a null measurement.

In the following, we compare the electrical characteristics of a cantilever sensor with a passive detector vs. one with an active detector, such as a FET. For the passive detectors, we use the values of the longitudinal piezoresistance coefficient in silicon given by Tortonese et. al. (Applied Physics Letters, 62, p.634, 1993, "Atomic Resolution with an Atomic Force Microscope with Piezoresistive Detection") for different crystallographic orientations and for both p-type and n-type resistors.

The Wheatstone bridge method developed by Tortonese et. al. for a piezoresitive sensor has the condition for minimum power dissipation corresponding to all the four arms of the bridge being of equal resistance. One of these resistors is located at the base of the cantilever, where the maximum stress is generated due to a force acting at the other (free) end. The piezoresistance of this resistor gives rise to an unbalanced signal in the bridge. For an input oscillator voltage V, the signal voltage is given by $V_s$=V.ΔR/R, where ΔR is the change in resistance R due to the applied force. Let the resistor on the cantilever be of length A along the length of the beam from the fixed end. Then, the fractional change in the resistance of this element is given by:

$$\frac{\Delta R}{R} = \left(\frac{\Delta R}{R}\right)_{Surface} \gamma = \frac{\gamma}{A}\int_0^A \frac{\Delta\rho}{\rho}(x)dx = \frac{\gamma}{A}\int_0^A \Pi_L T_S dx \qquad (1)$$

where, ã is a doping profile dependent scale factor between zero and one. A ã of 0 means that the cantilever is uniformly doped throughout its entire thickness and hence the fractional change in resistivity would be zero. On the other hand, a ã of one implies that the thickness of the piezo resistor is negligible compared to the thickness of the cantilever. For our calculations we assume that g=0.75. In the above equation, $P_L$ is the longitudinal piezoresistance coefficient (for silicon, n-type 11.7 Ω-cm, $P_L$=−1.022 e−9 m²/N) and $T_s$ is the stress at the surface. If P is the force acting at the free end of a simple cantilever of dimensions L,W,T, then $T_s$ is given by $$T_S(x) = \frac{M(x)y}{I} = \frac{M(x)T}{2I} = \frac{6P(x-L)}{WT^2} \quad (2)$$

$$\left|\frac{\Delta R}{R}\right| = \frac{6\gamma P \Pi_L \left(\frac{A}{2} - L\right)}{WT^2} \quad (3)$$

The sensitivity of the bridge signal $V_s$ to the applied force P is given by $$\frac{dV_S}{dP} = \frac{dV_S}{d\Delta R}\frac{d\Delta R}{dP} = \frac{V}{4}\frac{6\Pi_L\left(\frac{A}{2} - L\right)\gamma}{WT^2} \quad (4)$$

For V=1 volt, $P_L$=−1.022×10$^{-9}$ m$^2$/N (for silicon, n-type 11.7 Ω-cm), A=50 μm, L=200 μm, W=50 μm, T=5 μm, g=0.75 we get $dV_s/dP$=161 V/N and clearly depends upon the position of the piezoresistive detector which in this example was taken to be at the base of the cantilever. Assuming that the resistor (of length A) has a width $W_R$=12 μm and a thickness $T_R$=1 μm, (and the resistivity p=11.7 Ω-cm) the resistance R=487.5 kΩ and the power dissipated in the system is about 2 mW. The rins noise generated in the bridge operating in a 100 Hz bandwidth at a temperature of 1 K is given by $V_n$=(4 $k_B$ TRΔf)$^{05}$ and is equal to 16.4 nV. The input noise level of a good lock in amplifier in the same bandwidth is about 40 nV. For temperatures above 1 K, the resistor noise overwhelms the noise from the lock-in amplifier. Using 160 nV as the typical noise level for operation we calculate the minimum detectable force corresponding to a signal to noise ratio of unity to be 1 nanonewton.

Figure 2:
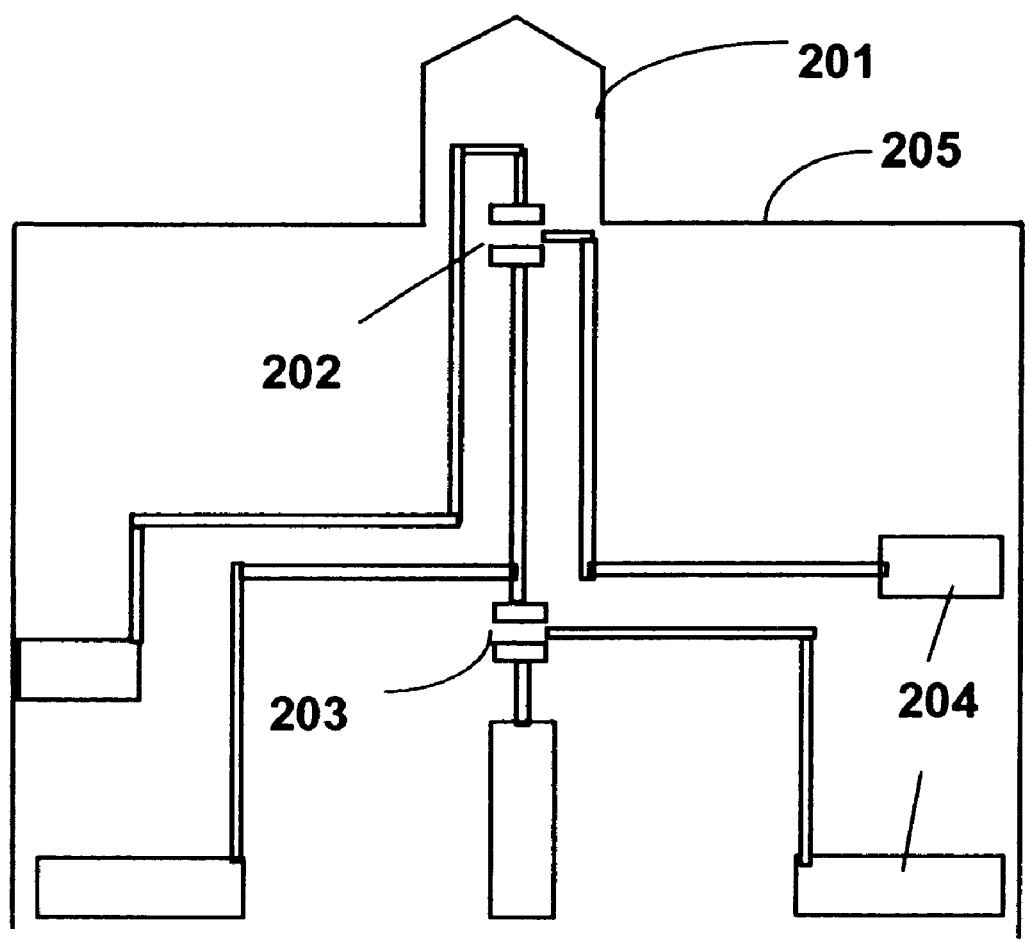
FIG. 2 a schematic of a Field Effect Transistor laid out on a cantilever.
Figure 3:
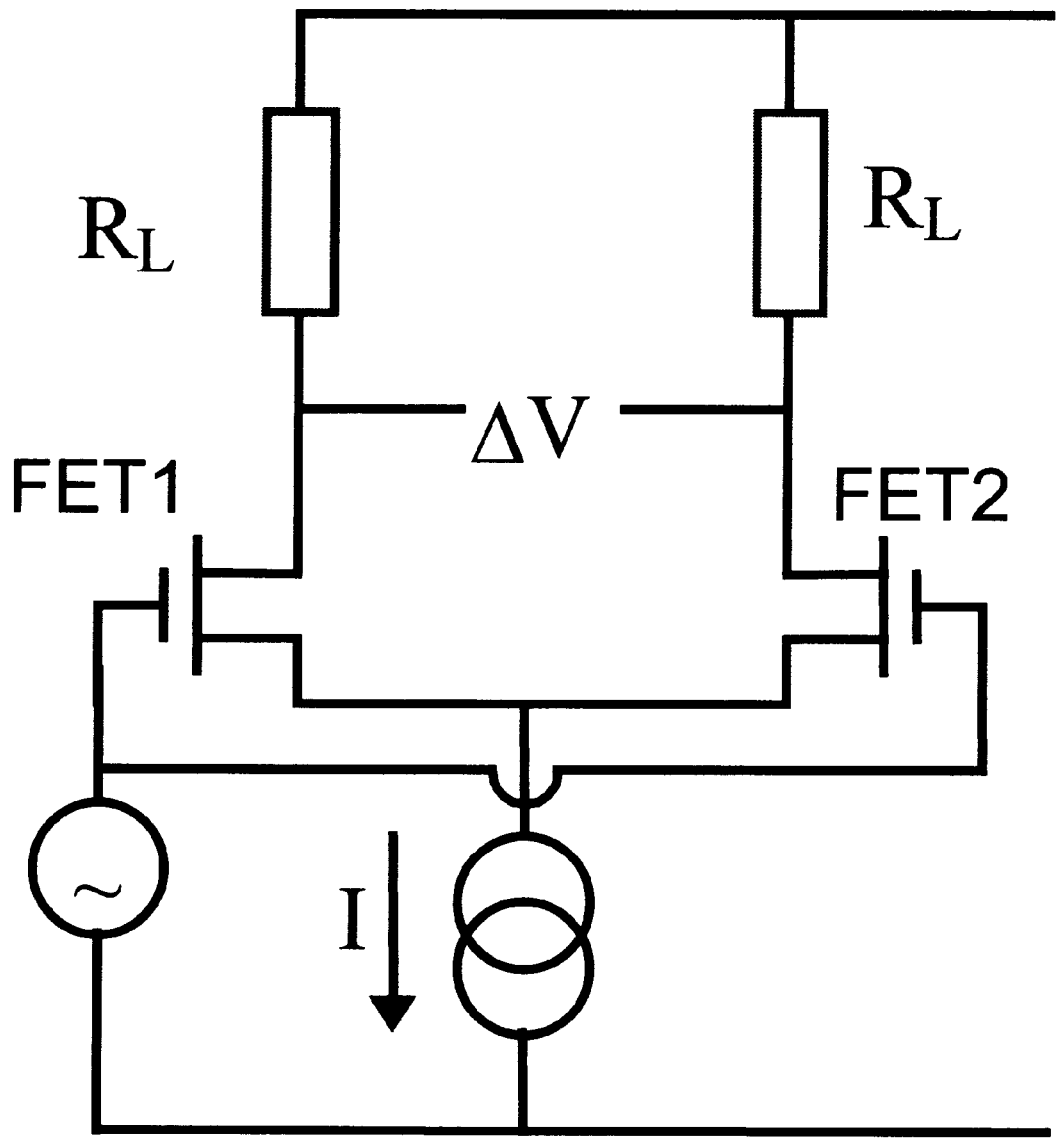
FIG. 3 a schematic of the differential amplifier configuration.

We compare this with typical performance levels observed with the active detection scheme with FETs. For the FET detection, the transistors are fabricated at the base of a cantilever with the channel oriented along the length of the cantilever, as shown in FIG. 2. Again, we choose the base of the cantilever to maximize the stress due to the applied force. Let us consider the balanced scheme of a differential amplifier shown in FIG. 3 where one of the transistors is strained and the other which is unstrained acts as the reference. For zero applied force, the quiescent drain current in each of the transistors is exactly half the current supplied by the current source in the tail of the differential amplifier and the output voltage ΔV=0. For a piezoresistive material, the applied stress (due to the force P) changes the β of the transistor. For a fixed gate voltage, this mechanism gives rise to a stress dependent variation in the drain current. If $\Delta I_D$ is the change in the drain current due to an applied force P, then $$\Delta V = 2R\Delta I_D \quad (5)$$

Let us first consider the piezoresistive effect. From the definition of piezoresistance we know that $$\frac{\rho_s - \rho}{\rho \Delta T} = \frac{1}{\rho}\frac{d\rho}{dT} = \frac{\Delta \rho}{\rho \Delta T} = \frac{\rho + \frac{d\rho}{dT}\Delta T - \rho}{\rho \Delta T} = \Pi_L \quad (6)$$

Where the subscript "s" refers to 'strained' values. Using $\rho$=1/(qnμ) and $\rho_s$=1/(qnμ$_s$) along with $\mu_s$=μ+(dμ/dT)ΔT into the above equation, we get $$\frac{1}{\rho}\frac{d\rho}{dT} = \frac{-\frac{1}{\mu}\frac{d\mu}{dT}\Delta T}{\Delta T} = -\frac{1}{\mu}\frac{d\mu}{dT} = \Pi_L \quad (7)$$

where $\Pi_l$ is the longitudinal piezoresistive coefficient and T is the stress in the channel. From equations that describe FET characteristics [give ref 17], we know that in the saturation region the drain current and β are given by:

$$I_D = -\frac{\beta}{2}(V_{GS} - V_O)^2 \quad (8)$$

$$\beta = \frac{W_{Ch}\varepsilon_I \mu}{L_{Ch}T_I} \quad (9)$$

Equation (2) gives the surface stress due to a force P as a function of the distance along the length of the cantilever. For a short channel ($L_{ch}$=2 mm), we ignore the stress variation along the channel and approximate it with the stress at the midpoint. Hence, the stress in the channel is given by $$T_S = \frac{6P\left(\frac{L_{Ch}}{2} - L\right)}{WT^2} \quad \text{and} \quad (10)$$

$$\frac{d\Delta V}{dP} = \frac{d\Delta V}{dI_D}\frac{dI_D}{d\beta}\frac{d\beta}{d\mu}\frac{d\mu}{dT_S}\frac{dT_S}{dP} \quad (11)$$

Using equations (6–10) in equation (11) we get $$\frac{d\Delta V}{dP} = 2R\frac{(V_{GS} - V_O)^2}{2}\frac{W_{Ch}\varepsilon_I}{L_{Ch}T_I}\Pi_L\mu\frac{6\left(\frac{L_{Ch}}{2} - L\right)}{WT^2}$$

$$= R\beta(V_{GS} - V_O)^2 \Pi_L \frac{6\left(\frac{L_{Ch}}{2} - L\right)}{WT^2} \quad (12)$$

For R=100 Ω, $V_G-V_O$=1V, $\Pi_L$=−1.022×10$^{-9}$ m$^2$/N (for silicon, n-type 11.7Ω-cm), L=200 μm, W=50 μm, T=5 μm, $L_{ch}$=2 μm, $W_{ch}$=40 μm, $T_I$=0.1 μm, $\epsilon_I$ =1.05×10$^{-10}$ F/m (for SiO$_2$), and the mobility μ=5 m$^2$/V-s, we get dΔV/dP=1.025× 10$^4$ V/N.

In an insulating gate field effect transistor (IGFET), the charges in the channel are all in a state of dynamic equilibrium and are subject to random fluctuations which give rise to similar fluctuations in the gate charge. Variations of charge between the depletion region, the inversion layer, and the surface states at the insulator semiconductor interface can alter the instantaneous value of $V_{GS}$ giving rise to 1/f noise. In an IGFET, the noise at low frequencies is primarily 1/f noise, this will tend to dominate thermal and shot noise at frequencies less than say 20 kHz in most IGFETs. We estimate that this is of the order of a few nV per root hertz. With the above dimensions, gate channel capacitance is calculated to be about 0.08 pF. For a 100 Hz bandwidth, the noise is a few tens of nV, lets us say 50 nV in the gate voltage. This corresponds to a noise level of 1 mV in the drain voltage This noise dominates all the other sources, even for operation in a dilution refrigerator in a high field magnet Hence, the minimum detectable signal is about 0.1 nN. This can be improved further by operating at a higher drain current. Hence, we see that the FET design improves the sensitivity of the system by an order of magnitude at least.

For the cantilever magnetometer, assuming that there is only a pure torque term, the stress along the beam is constant and is given by $$T_{s,\tau} = 6\tau/W_1T^2.$$

Using this, the analog of equation (12) is given by $$\frac{d\Delta V}{d\tau} = 2R\frac{(V_{GS}-V_O)^2}{2}\frac{W_{Ch}\varepsilon_l}{L_{Ch}T_l}\Pi_L\mu\frac{6}{W_1T^2} \quad (13)$$

With the above given parameters we estimate the torque sensitivity (for the silicon cantilever) to be $1.61\times10^{-5}$ V/Nm. Using above estimated drain voltage noise level of 1 mV, we get the minimum detectable torque to be about 6 picoNm, which corresponds to an emu sensitivity of $6\times10^{-10}$ emu at 10 tesla. A Commercial Vibrating Sample Magnetometer has a sensitivity of $5\times10^{-5}$ emu at the same field. The commercial torque magnetometer supplied by Oxford Instruments has a sensitivity of ~$10^{-7}$ to $10^{-8}$ emu.

Figure 5:
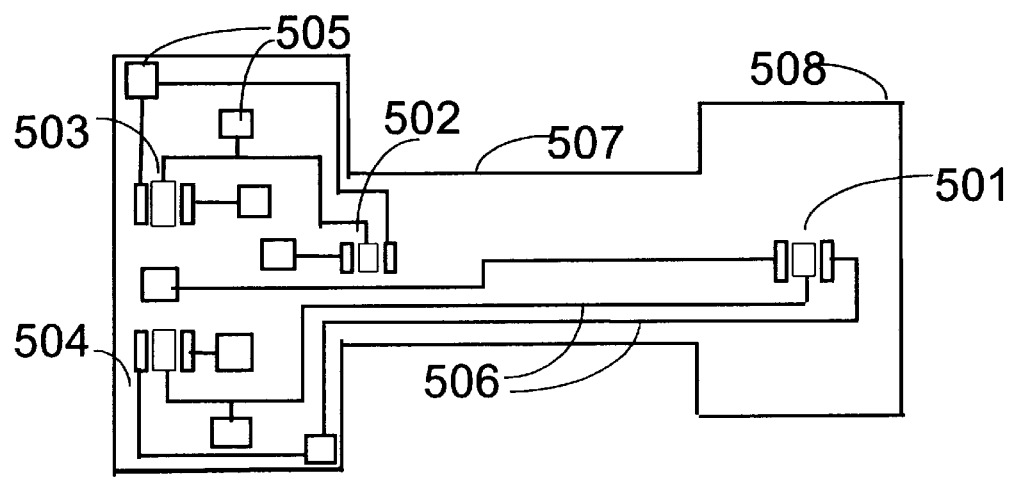
FIG. 5 depicts the top surface of the layout of the first preferred embodiment of a cantilever sensor fu etectors and a magnetic tip.

Instead of a pure torque term as assumed above, if there is a pure force term, P, deflecting the cantilever as shown in FIG. 5, then the surface stress is given by $$T_{s,p}=6P\ (x-L)/W_1T^2$$

Thus, the voltage shift implied by equation (12) depends on the position x of the FET shown in FIG. 5. Therefore, by using two separate FETs one at the base of the cantilever and the other close to the free end, two separate voltage signals are obtained—the FET at the base responding purely to a force and the FET at the free end purely to a torque.

CANTILEVER SENSOR MANUFACTURING PROCESS

Figure 4:
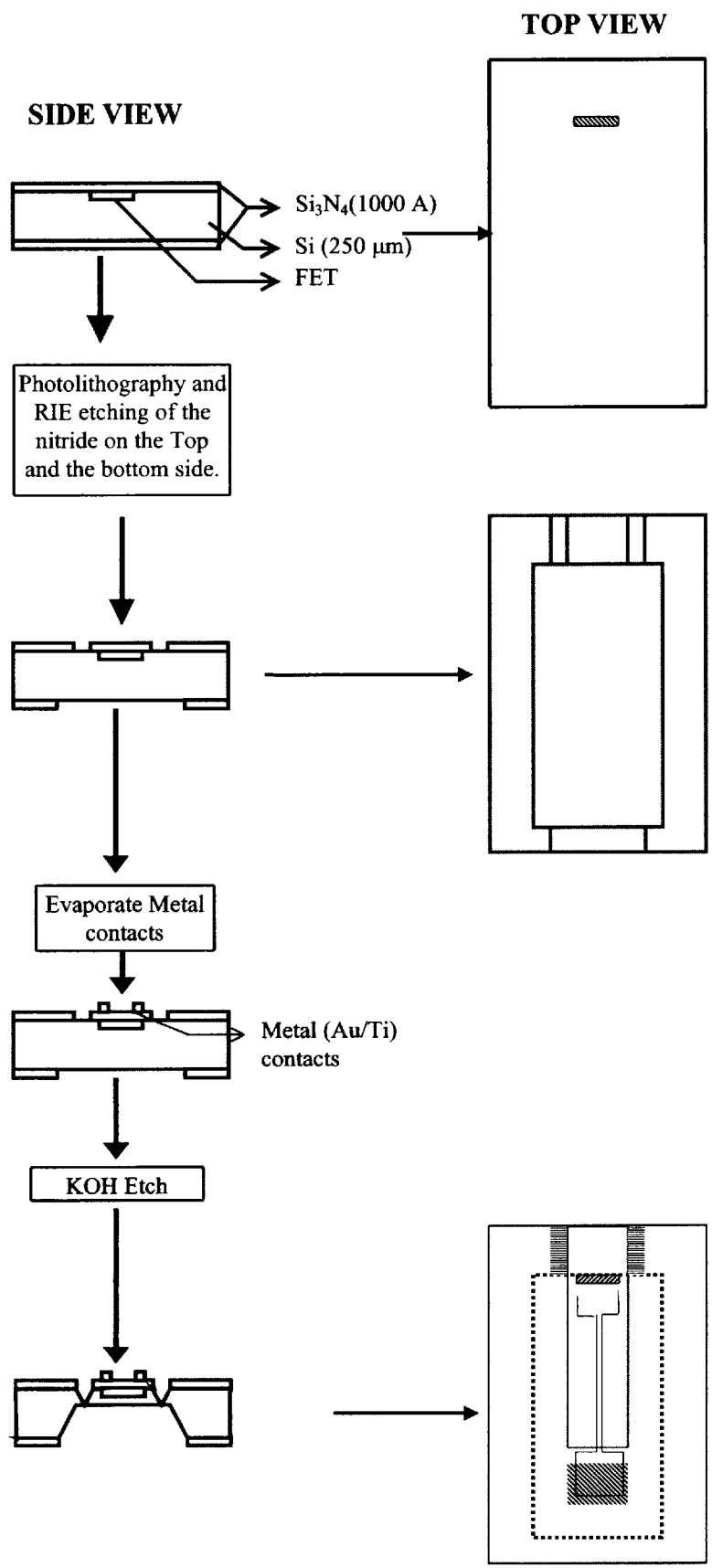
FIG. 4 depicts the cantilever and FET manufacturing process.

The cantilever sensor with FET detectors was fabricated using standard lithography techniques and the entire process is sketched in FIG. 4. Starting with a 250 micrometer thick, p-type <100> oriented, double polished wafer, a simple Al gate FET was fabricated on the top surface. For the FET fabrication, the wafer was oxidized in a diffusion furnace. Openings for the source and drain areas were then made using conventional photolithography process, and the source and drain were formed simultaneously by diffusing phosphorous through the openings. The oxide in the area between the source and drain was then stripped chemically and a thin (0.1 micrometer) gate oxide was grown in a dry oxygen atmosphere. Aluminum metalization of the source, drain, and gate contacts were next done using a liftoff process. The top surface was then covered with a thick layer of PECVD nitride (or a polyimide such as pyralin) which acted as the etch mask in the anisotropic etchant. The next step was to machine the silicon into a cantilever. The nitride on the top and bottom surfaces was patterned as shown in the top view in FIG. 4. The alignment between the front side and back was achieved by using wafer flats as the marker. The width of the channel on the top surface determined the etch depth at the front surface. Additional windows were opened in the nitride and gold metal contacts were made to the FET. The wafer was then etched in KOH solution. After the formation of the V groove was complete, the etch rate at the top surface was reduced to $1/400^{th}$ of its initial value. The side walls comprising the V groove were formed by the <111> planes which have a much smaller etch rate in KOH. The bulk of the silicon was etched away through the window opened on the bottom surface. When the bottom etch surface met the V grooves on the top surface, the small rectangular island next to the cantilever was completely released and dropped into the etch solution.

Fabrication of Integrated Magnetic Tip

For the magnetic tip, we first evaporate 1 micrometer of iron onto the front side of the silicon wafer and use this as the masking layer for the formation of the tip. This iron layer is patterned to form 5 micrometer dots. Then, the silicon on the front side is etched with a slightly anisotropic dry etch, such as $CF_4$ plasma. During the undercut that occurs during the etch process, a tip starts forming. Once the tip is formed, an oxidation sharpening of the resufting Fe/Si tip is developed. The final result is a tip which is mostly made out of silicon and has iron only at the very end of the tip (~300A).

FIG. 5 is the top view of the layout of first preferred embodiment of the cantilever sensor with four detectors and a tip. The detector FET 501 is at the free end of the cantilever 507 and forms a differential pair with the reference FET 504 to which it is connected by metallization 506. The differential pair 501 and 504 produce a voltage signal proportional to the torque on the tip or sample 608 of FIG. 6 which is the cross-sectional view of cantilever of FIG. 5. The FETs 502 and 503 form a similar differential pair and produce a voltage proportional to the force acting on the tip or sample 608. The metal contact pads such as 505 are used to connect external circuitry to the FETs on the cantilever.

Figure 6:
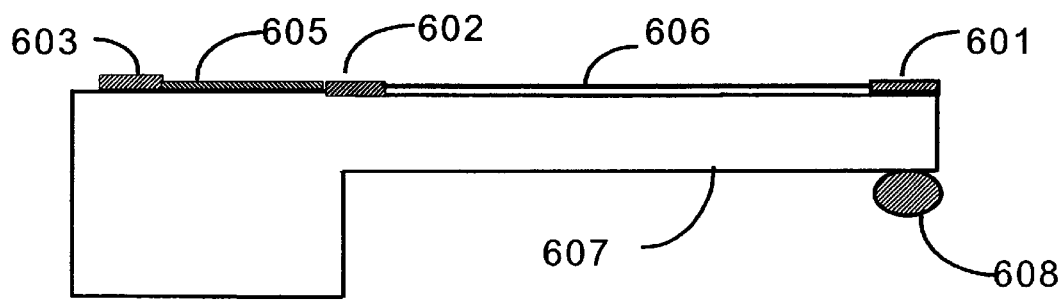
FIG. 6 depicts a cross-sectional view of the cantilever shown in FIG. 5.

FIG. 6 is a side cross-sectional view of the cantilever sensor shown in FIG. 5. The FETs 601, 602, 603 are fabricated on the silicon cantilever 607 and are interconnected by metal lines 606 and 605. A magnetic tip or sample 608 is attached to the free end of the cantilever.

Figure 7:
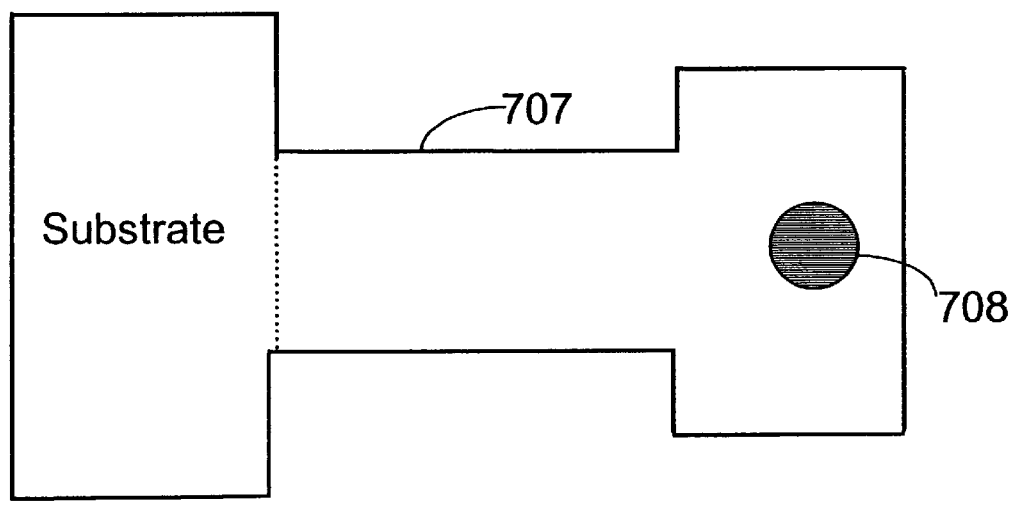
FIG 7 depicts the bottom surface of the preferred embodiment of the cantilever sensor shown in FIG. 5.

FIG. 7 is the bottom view of the cantilever of FIG. 5. The magnetic tip or sample 708 is at the free end of the cantilever 707.

While the present invention has been described with reference to a few specific embodiments, the description is illustrative of the invention and should not be construed as limiting the invention. Various modifications of the described embodiments can occur without departing from the true spirit and scope of the invention as defined by the appended claims. In general, low spring constant cantilevers with at least two strain sensors placed strategically at different points, the sensors being preferably of the active type, will have torque sensitivity of six picoNewton-meter and a force sensitivity of one hundred picoNewton depending on the application.

What is claimed is:

1. A cantilever structure for use in a mechanical deflection device; said cantilever structure having a fixed end; and a free end, a first piezo-active detector on the surface of said cantwver arm, at said fixed end of said cantilever structure, and a second piezo-active detector at a sensing point proximate said free end; each of said first piezo-active detector and said second piezo-active detector having integrated amplification circuitry.

2. The cantilever structure of claim 1, where said free end of said cantilever structure includes a magnetic material shaped to form a sharp tip.

3. The cantilever structure of claim 1, wherein said cantilever structure is mounted in a mechanical deflection measuring device, for measuring a characteristic between two surfaces.

4. The cantilever structure of claim 3, wherein said device is a magnetic force microscope.

5. The cantilever structure of claim 3, wherein said device is a magnetic disk drive.

6. The cantilever structure of claim 3, wherein said device is a magnetic resonance force microscope.

7. The cantilever structure of claim 3, wherein said device is an accelerometer.

8. The cantilever structure of claim 3, wherein said cantilever structure free end is in proximity to an external magnetic field, whereby deflection of said free end of said cantilever structure is produced by a force at said free end due to an interaction between said free end and said external magnetic field, and wherein said force produces a surface strain at said first detector at said fixed end of said cantilever structure and no strain at said second detector and whereby torquing of said free end of said cantilever structure produced by a force at said free end due to an interaction between said free end and said external magnetic field produces no strain at first detector at said free end, and produces strain at second detector at said free end of said cantilever structure.

9. The cantilever structure of claim 8, further comprising a third detector, said third detector being proximate said first detector, at a position at which neither deflection nor torquing of said free end produces a strain at said third detector.

10. The cantilever structure of claim 3, further comprising first means to detect a change in said first predetermined physical property at first detector means and second means to detect a chance in said second predetermined physical property at second detector means whereby a force induced strain is exerted at said free end of said cantilever structure, and wherein said force induced strain produces a change in a first predetermined physical property at said first detector and a torque induced strain is exerted at said free end of said cantilever structure, and wherein said torque induced strain produces a change in a second predetermined physical property at said second detector.

11. The cantilever structure of claim 10, wherein at least one of said first physical property and said second physical property is electrical resistance.

12. The cantilever structure of claim 10, wherein at least one of said first physical property and said second physical property is surface strain dependent.

13. The cantilever structure of claim 10, wherein at least one of said first detector and said second detector is a surface resistor and wherein said physical property of said surface resistor is piezoresistance.

14. The cantilever structure of claim 10, wherein at least one of said first detector and said second detector is a surface piezo material and wherein said physical property of said surface piezomaterial is piezovoltage.

15. The cantilever structure of claim 10, wherein at least one of said first detector and said second detector is selected from the group consisting of a surface tunnel junction resistance resistor, a metal-insulator-metal tunnel junction, or superconductor-insulator-superconductor tunnel junction and wherein said physical property of said tunnel junction is piezoresistance.

16. The cantilever structure of claim 10, wherein at least one of said first detector and said second detector is a field effect transistor.

17. The cantilever structure of claim 13, further comprising a voltage measuring apparatus coupled to each of said first detector and said second detector, said voltage measuring apparatus measuring difference voltage corresponding to the difference in the strains at said first detector and said second detectors, wherein said difference voltage corresponding to the difference in the strains, corresponds to the force and the torque contributions to the deflection of said free end of said cantilever structure.

18. The cantilever structure of claim 17, further comprising an integral amplification circuitry amplifying said difference voltage.

19. The cantilever structure of claim 18, wherein said integral amplification circuitry is formed on said cantilever structure.

20. The cantilever structure of claim 18, wherein said cantilever structure includes a substrate member, and said integral amplification circuitry is formed on said substrate.

21. The cantilever structure of claim 18, wherein said substrate wherein is a member selected from the group consisting of silicon, glass, quartz, or a polymeric material.

22. The cantilever structure of claim 13, wherein a region of substrate below the cantilever arm is substantially removed so as to form a cantilevered section and a non-cantilevered section.

23. The method of measuring the mechanical deflection of a cantilever structure, having a fixed end and a free end, a first piezo-active detector on the surface of said cantilever arm, at said fixed end of said cantilever structure, and a second piezo-active detector at a sensing point proximate said free end, each of said first piezo-active detector and said second piezo-active detector having integrated amplification circuitry, comprising the steps of: bringing said cantilever structure free end proximate a material; sensing surface strain at said first detector, produced by a force due to an interaction between said free end and said material; and sensing at said second detector a surface strain at said second detector produced by torquing of said free end of said cantilever structure due to an interaction between said free end and said material.

24. The method of claim 23, wherein a force induced strain is exerted at said free end of said cantilever structure, and wherein said force induced strain produces a change in a first predetermined physical property at said first detector and a torque induced strain is exerted at said free end of said cantilever structure, and wherein said torque induced strain produces a change in a second predetermined physical property at said second detector, further comprising the steps of measuring a change in said first predetermined physical property at each of said first detector means and measuring a change in said second predetermined physical property at said second detector.

25. The method of claim 24, wherein at least one of said first physical property and said second physical property is electrical resistance.

26. The method of claim 24, wherein at least one of said first detector and said second detector is a surface resistor and wherein said physical property of said surface resistor is piezoresistance.

27. The method of claim 24, wherein at least one of said first detector and said second detector is a surface resistor and wherein said physical property of said surface resistor is piezovoltage.

28. The method of claim 24, wherein at least one of said first detector and said second detector is selected from the group consisting of a surface tunnel junction resistance resistor, a metal-insulator-magnetic metal tunnel junction, or superconductor-insulator-superconductor tunnel junction and wherein said physical property of said surface resistor is piezoresistance.

29. The method of claim 24, wherein at least one of said first detector and said second detector is a field effect transistor.

30. The method of claim 24, further comprising measuring difference voltage corresponding to the difference in the strains at said first detector and said second detectors, wherein said difference voltage corresponding to the difference in the strains, corresponds to the force and the torque contributions to the deflection of said free end of said cantilever structure.

* * * * *